(12) United States Patent
Wang et al.

(10) Patent No.: US 7,904,667 B2
(45) Date of Patent: Mar. 8, 2011

(54) SYSTEMS AND METHODS FOR MONITORING AND CONTROLLING BINARY STATE DEVICES USING A MEMORY DEVICE

(75) Inventors: Yunsheng Wang, San Jose, CA (US); Casey Springer, Portland, OR (US); Tak Kwong Wong, Milpitas, CA (US); Bill Beane, Gustine, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 633 days.

(21) Appl. No.: 11/503,431

(22) Filed: Aug. 10, 2006

(65) Prior Publication Data

US 2006/0277372 A1 Dec. 7, 2006

Related U.S. Application Data

(63) Continuation-in-part of application No. 10/992,428, filed on Nov. 17, 2004.

(51) Int. Cl.
*G06F 13/20* (2006.01)
(52) U.S. Cl. .......... 711/149; 711/101; 711/131; 711/154
(58) Field of Classification Search .................. 711/149, 711/101, 131
See application file for complete search history.

(56) References Cited

U.S. PATENT DOCUMENTS

| | | | |
|---|---|---|---|
| 4,472,776 A | 9/1984 | Deleris et al. | |
| 4,901,345 A | 2/1990 | Imagawa | |
| 5,771,345 A * | 6/1998 | Tallman et al. | 714/30 |
| 5,796,994 A * | 8/1998 | Chambers et al. | 713/500 |
| 5,889,724 A | 3/1999 | Khang et al. | |
| 5,978,307 A | 11/1999 | Proebsting et al. | |
| 6,101,579 A | 8/2000 | Randolph et al. | |
| 6,429,677 B1 | 8/2002 | Montrose | |
| 6,546,461 B1 * | 4/2003 | Au et al. | 711/131 |
| 6,556,938 B1 | 4/2003 | Rohrbaugh et al. | |
| 6,681,193 B2 | 1/2004 | Dallavalle | |
| 6,795,889 B2 | 9/2004 | Berg et al. | |
| 7,080,191 B2 * | 7/2006 | Murdock et al. | 711/101 |
| 7,747,828 B2 | 6/2010 | Wang et al. | |
| 2001/0043506 A1 | 11/2001 | Arcoleo et al. | |

(Continued)

FOREIGN PATENT DOCUMENTS

WO WO 2006/055149 A1 5/2006

OTHER PUBLICATIONS

Office Action dated Jan. 10, 2007, in U.S. Appl. No. 10/992,428.

(Continued)

*Primary Examiner* — Yong Choe
(74) *Attorney, Agent, or Firm* — Hayes Boone LLP

(57) ABSTRACT

A static random access memory (SRAM) includes an input read register (IRR) for monitoring the state of external binary devices and an output drive register (ODR) for controlling the state of external binary devices. The SRAM can be a multi-port device for access by multiple processors or controllers. Each bit of the IRR can mirror the state of a connected external binary device. Each bit of the ODR can manipulate the state of a connected external binary device or can be read without changing the state. The memory device may include settable controlling bits and a set of controlled register bits. Setting the one or more controlling bits may define which controlled register bits are associated with the IRR and which are associated with the ODR.

20 Claims, 7 Drawing Sheets

U.S. PATENT DOCUMENTS

2003/0135698 A1     7/2003    Berg et al.
2003/0193051 A1    10/2003    Beech
2006/0106989 A1     5/2006    Wang et al.

OTHER PUBLICATIONS

Response dated Apr. 10, 2007, in U.S. Appl. No. 10/992,428.
Internationl Search Report and Written Opinion received in PCT Application No. PCT/US05/37238, mailed Apr. 4, 2006.
Final Office Action dated Jul. 9, 2007, in related U.S. Appl. No. 10/992,428.
Amendment Under 37 CFR 1.114 filed Oct. 9, 2007, in related U.S. Appl. No. 10/992,428.
Restriction Requirement dated Jan. 9, 2008, in related U.S. Appl. No. 10/992,428.
Response to Restriction Requirement filed Feb. 5, 2008, in related U.S. Appl. No. 10/992,428.
Office Action dated Apr. 1, 2008, in related U.S. Appl. No. 10/992,428.
Amendment and Response to Office Action filed Jul. 1, 2008, in related U.S. Appl. No. 10/992,428.
Final Office Action dated Oct. 28, 2008, in related U.S. Appl. No. 10/992,428.
Amendment After Final filed Jan. 28, 2009, in related U.S. Appl. No. 10/992,428.
Advisory Action dated Feb. 3, 2009, in related U.S. Appl. No. 10/992,428.
Office Action dated Apr. 28, 2009, in related U.S. Appl. No. 10/992,428.
International Preliminary Report on Patentability dated May 31, 2007, in related PCT Application No. PCT/US2005/037238.
Preliminary Amendment filed Oct. 13, 2005, in related U.S. Appl. No. 10/992,428.
Supplemental Preliminary Amendment filed Jun. 20, 2006, in related U.S. Appl. No. 10/992,428.
Amendment and Response to Office Action filed Jul. 24, 2009, in related U.S. Appl. No. 10/992,428.
Notice of Allowance mailed Oct. 30, 2009, in related U.S. Appl. No. 10/992,428.
Notice of Abandonment mailed Feb. 18, 2010, in related U.S. Appl. No. 10/992,428.
Petition for Revival of an Application for Patent Abandoned Unintentionally Under 37 CFR 1.137(b) filed Mar. 1, 2010, in related U.S. Appl. No. 10/992,428.

* cited by examiner

SYSTEMS AND METHODS FOR MONITORING AND CONTROLLING BINARY STATE DEVICES USING A MEMORY DEVICE

CROSS-REFERENCE TO RELATED APPLICATIONS

This is a continuation-in-part of U.S. patent application Ser. No. 10/992,428, filed Nov. 17, 2004, which is hereby incorporated by reference in its entirety.

BACKGROUND OF THE INVENTION

1. Field of the Invention

Generally, the invention relates to static random access memories (SRAMs). More specifically, the invention relates to multi-port SRAMs that include input read registers and output drive registers for controlling and monitoring binary state devices.

2. Description of the Related Art

Microprocessors and microcontrollers have become a ubiquitous part of everyday life. They can be found in virtually all types of products available today: from transportation and manufacturing equipment, to consumer electronics, household appliances and children's toys. Processors control and monitor all or part of the functionality of these products using their general-purpose input/output (GPI/O) connections. This control can typically include such things as turning binary devices on and off for functional signaling to an end-user (e.g., toggling light emitting diode power to indicate whether a product is on or off, etc.) and monitoring the state of binary devices for system oversight (e.g., checking switch state to see whether a certain product function has been selected).

However, the number of GPI/O connections available for any given microprocessor or microcontroller is limited by, among other factors, the physical size of the processor. As the system demands on the GPI/O connections increase in number, a system designer is forced to choose between competing demands, selecting some at the expense of others. If the system designer desires to facilitate more demands than a processor's GPI/O connections can accommodate, the system designer must include external circuitry or use external input/output (I/O) processors to handle the overflow or excess demands. Both of these I/O overflow solutions are time, space, power and cost inefficient.

Also used within the typical microcontroller system of today is a random access memory (RAM), particularly a static RAM, or SRAM. An SRAM is a type of read/write memory that holds its data, without external refresh, for as long as power is supplied to it. An SRAM is typically used as external cache memory for processors and controllers. Cache memory is commonly used to store and retrieve commands, instructions and/or data that are frequently needed or used by the processor. In some applications, an SRAM can also be used as the main memory of a processor. An SRAM capable of interfacing with multiple processors, for example as cache memory and/or main memory, is commonly known as a multi-port SRAM (e.g., a dual-port device interfaces with two processors, etc.).

FIG. 1 illustrates a typical block diagram for a system 100 with multiple processors that control and/or monitor binary state devices 190, among other functions, and that access a multi-port SRAM 150. As shown in FIG. 1, N processors 111-113 are each connected to N ports 121-123, respectively, of the multi-port SRAM 150. Each of the N processors 111-113 is further connected to a variety of binary state devices 190 using the processors' GPI/O connections (not shown). The typical command within a processor to control a binary state device is a read/write to the GPI/O port that is coupled to that device. As an example of a limitation of the system in FIG. 1, assume that there are nine binary state devices 190. Further assume that N equals 3 and that each of three processors 111-113 has three GPI/O connections. In this case, all nine of the binary state devices 190 can be controlled or monitored by the processors 111-113 (i.e., each of the three processors 111-113 can be connected to three of the nine binary state devices 190).

However, with continued reference to FIG. 1, consider a further example where the number of binary state devices 190 in the system 100 exceeds the cumulative number of GPI/O connections for all of the N processors 111-113 (e.g., N equals one, total number of GPI/O equals three and the number of devices equals four). In this example, either additional, external means for controlling and/or monitoring the excess device(s) must be added to system 100, or the excess device(s) must be eliminated from the system 100. As previously discussed, adding external circuitry, such as external input/output (I/O) processors, to system 100 for handling the excess device(s) is time, space, power and cost inefficient. Likewise, excluding a binary state device 190 from control by the processors 111-113 may not be an option based on customer demands and system requirements.

Thus, what is needed is an external means for one or more processors to control and/or monitor binary state devices without adding additional circuit elements to the processor-based system, thus freeing up or expanding the functionality of the processors' GPI/O connections.

SUMMARY OF THE INVENTION

A static random access memory (SRAM) includes an input read register (IRR) for monitoring the state of external binary devices and an output drive register (ODR) for controlling the state of external binary devices. The SRAM can be a multi-port device for access by multiple processors or controllers. Each bit of the IRR can mirror the state of a connected external binary device, and can be read to a connected processor using a standard read instruction. Each bit of the ODR can manipulate the state of a connected external binary device by providing the device with a path to ground. Each bit of the ODR can also be read without changing the state, or interrupting the operation of, the connected external binary device. When set to the proper mode, the addresses used for the IRR and ODR can be used with the SRAM main memory array for standard memory operations. The memory device may also include one or more settable controlling bits and a set of controlled register bits. Setting the one or more controlling bits may define which controlled register bits are associated with the IRR and which are associated with the ODR.

A method according to aspects of the invention can be used for controlling states of external binary devices coupled to a memory device. This exemplary method can include a step for coupling one or more processors to the memory device. Another step can read, using the processors, to a first memory location of the memory device, wherein the first memory location includes at least one bit that reflects a first state of a first external binary device. A further step can read, using the processors, to a second memory location of the memory device, wherein the second memory location includes at least one bit that reflects a second state of a second external binary device. The method can include an additional step for writing, using the processors, to the second memory location of the memory device, wherein the bit of the second memory location controls the change of the second state to a third state of the second external binary device. The method may include setting one or more controlling bits and determining, based on the controlling bits, which controlled register bits will reflect the state of a first external binary devices.

A further method according to aspects of the invention can be used for controlling states of external binary devices coupled to a memory device. This exemplary method includes a means for coupling processors to the memory device, a means for monitoring a first state of a first external binary device, and a means for manipulating a second state of a second external binary device. This method may include determining, based on the one or more controlling bits, which bits from a set of controlled register bits will be used to control the states of external binary devices coupled to the memory device.

A system for controlling and monitoring one or more binary state devices can include a multi-port memory device and a plurality of processors. The multi-port memory device can include a memory array coupled to a plurality of ports, the memory array having a plurality of memory locations, each memory location associate with a memory address. The multi-port memory device can include one or more input read registers and one or more output drive registers. The memory device may further include settable controlling bits and a set of controlled register bits. Setting the controlling bits may define which controlled register bits are associated with the IRR and which are associated with the ODR. Each input read register can be associated with a first memory address and can be coupled to a first set of binary state devices and can have a corresponding first set of input read register bits, such that each first set bit is capable of reflecting a state of each corresponding first set device. Each output drive register can be associated with a second memory address and can be coupled to a second set of the binary state devices and can have a corresponding second set of output drive register bits, such that each second set bit is capable of reflecting a state of each corresponding second set device and is further capable of controlling the state of each corresponding second set device. Additionally, the plurality of processors can be coupled to the plurality of ports, wherein each processor is capable of executing an instruction that reads to the first memory address, and reads and writes to the second memory address.

Additional aspects of the invention will be set forth in part in the detailed description which follows, and in part will be apparent from this disclosure, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention as claimed.

BRIEF DESCRIPTION OF THE DRAWINGS

These and other aspects and features of the invention will become apparent to those ordinarily skilled in the art upon review of the following detailed description of specific embodiments of the invention in conjunction with the accompanying figures, wherein.

DETAILED DESCRIPTION OF THE INVENTION

The invention will now be described in detail with reference to the drawings, which are provided as illustrative examples of the invention so as to enable those skilled in the art to practice the invention and are not meant to limit the scope of the invention. Where certain elements of the invention can be partially or fully implemented using known components, only those portions of such known components that are necessary for an understanding of the invention will be described, while detailed descriptions of other portions of such known components will be omitted so as to not obscure the invention. Further, the invention encompasses present and future known equivalents to the components referred to herein by way of illustration.

Figure 1:
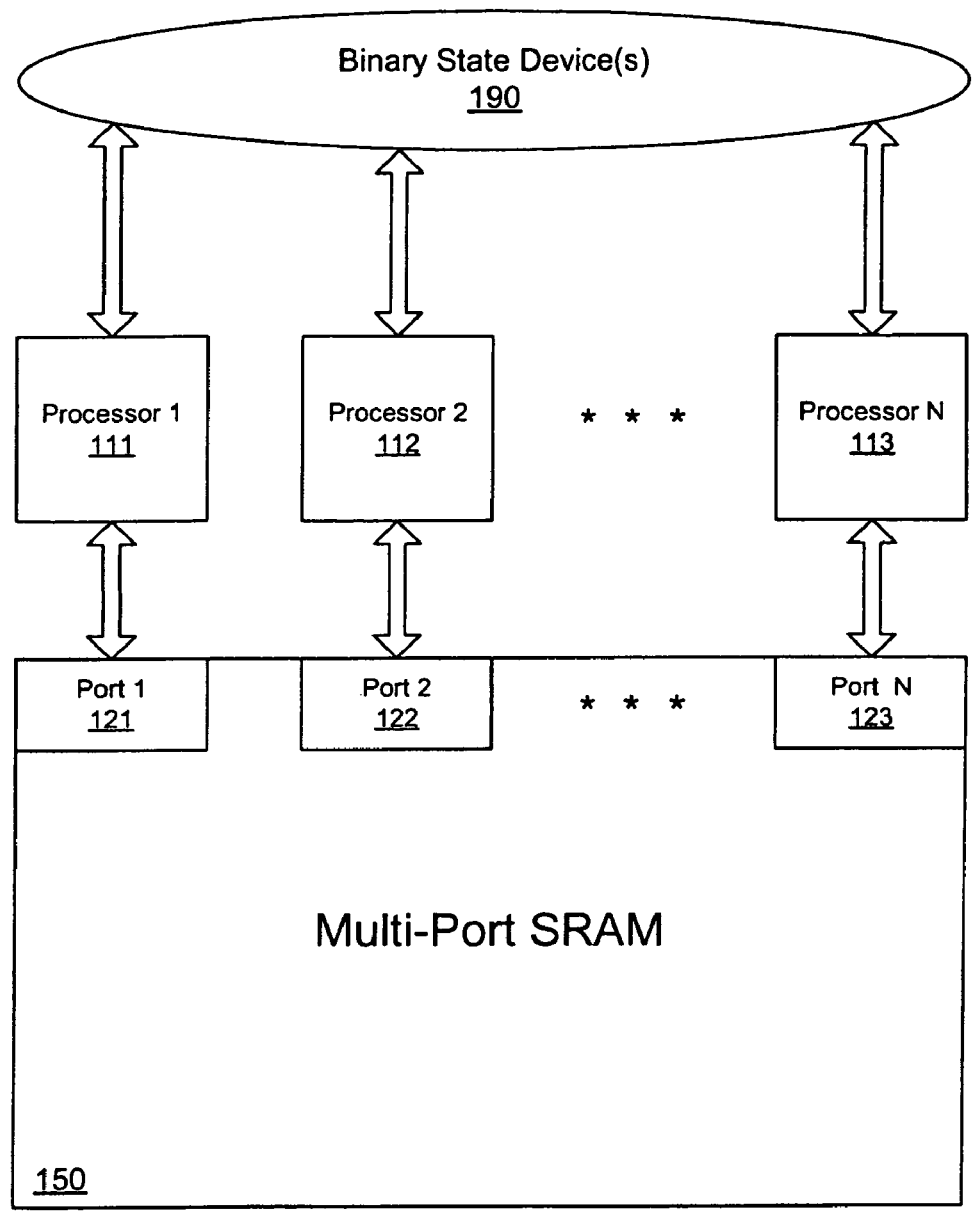
FIG. 1 illustrates a typical block diagram for multiple processors that control and/or monitor binary devices, and that each access a multi-port SRAM.
Figure 2:
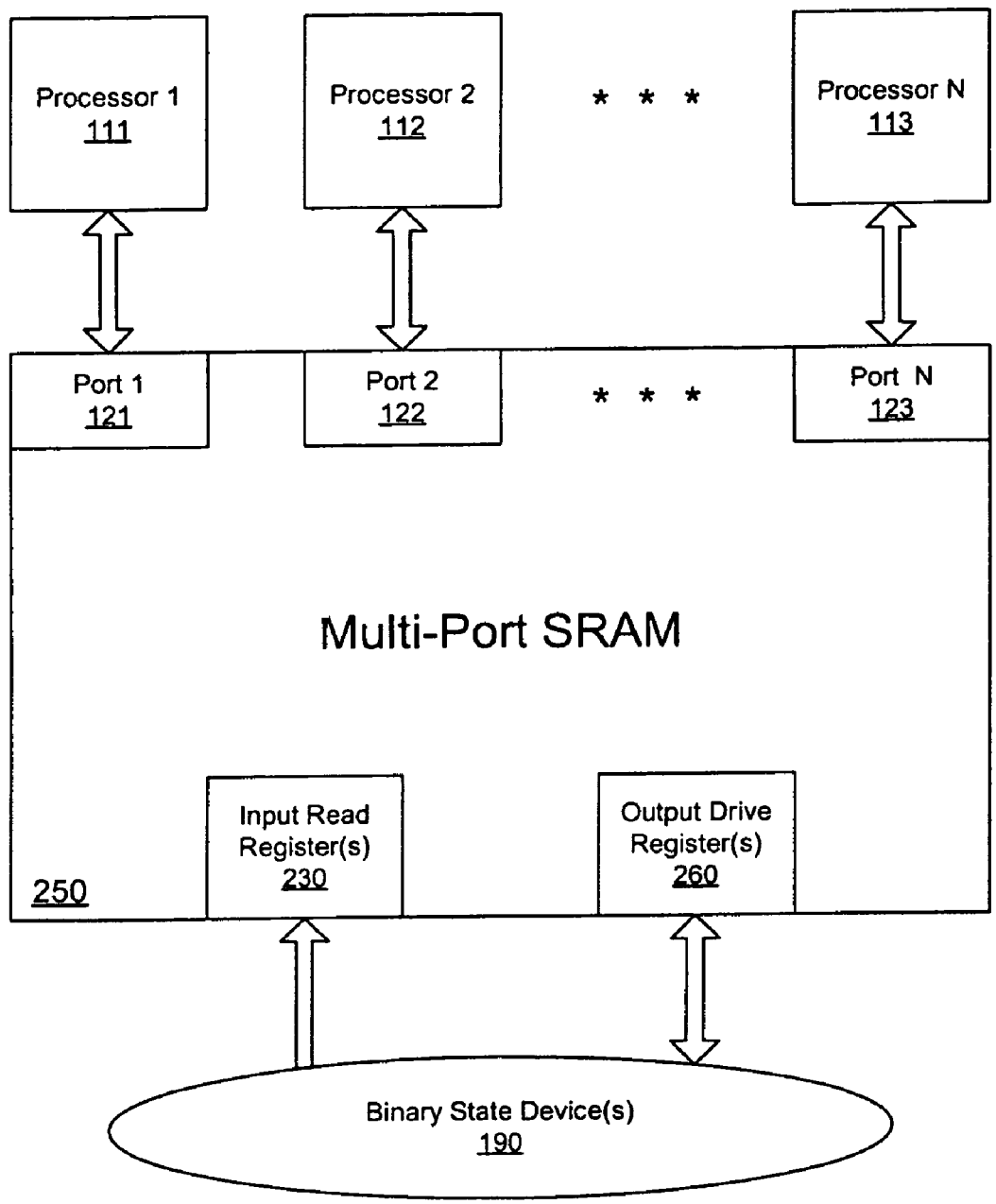
FIG. 2 illustrates a generalized multi-port static random access memory (SRAM) according to some embodiments of the invention.

FIG. 2 illustrates a generalized multi-port static random access memory (SRAM) according to some embodiments of the invention. As shown in FIG. 2, the multi-port SRAM 250 includes N ports 121-123 that are coupled to N processors 111-113, respectively. As used herein, the terms processor, controller, microprocessor and microcontroller generally indicate any type of computing device or combination of devices (e.g., electronic, optical, organic, discrete, highly-integrated, etc.) capable of executing an instruction set (e.g., reduced instruction set, complex instruction set, etc.) that at least includes a read instruction and a write instruction to a memory device. Each term, whether used in the singular or plural form, is meant to indicate one or more of such computing devices or combinations of devices.

The exemplary multi-port SRAM 250 also includes one or more input read registers 230 and one or more output drive registers 260. Input read registers 230 and output drive registers 260 allow for monitoring and controlling binary state devices 190 by any of the N processors 111-113 through the standard interface between processors 111-113 and ports 121-123 of the multi-port SRAM 250. Any of the N processors 111-113 can access input read registers 230 and output drive registers 260 by simply reading or writing to the memory address associated with the register. Once a read or write request is detected to one of these registers and the appropriate read enable or write enable signal is set (discussed in further detail below), the requesting processor will be allowed to read or write to the appropriate register, thereby monitoring or controlling the binary state devices 190. When not set to control or monitor binary state devices 190, the addresses used for the input read registers 230 and output drive registers 260 of the present invention can be used by the SRAM main memory array for standard memory operations. The inclusion of the input read register (IRR) 230 and the output drive register (ODR) 260 frees up the processor general-purpose input/output (GPI/O) connections, or pins, for other or additional tasks, and does so without forcing the system designer to include additional I/O-handling circuitry in the design; an SRAM can be there anyway.

Figure 3:
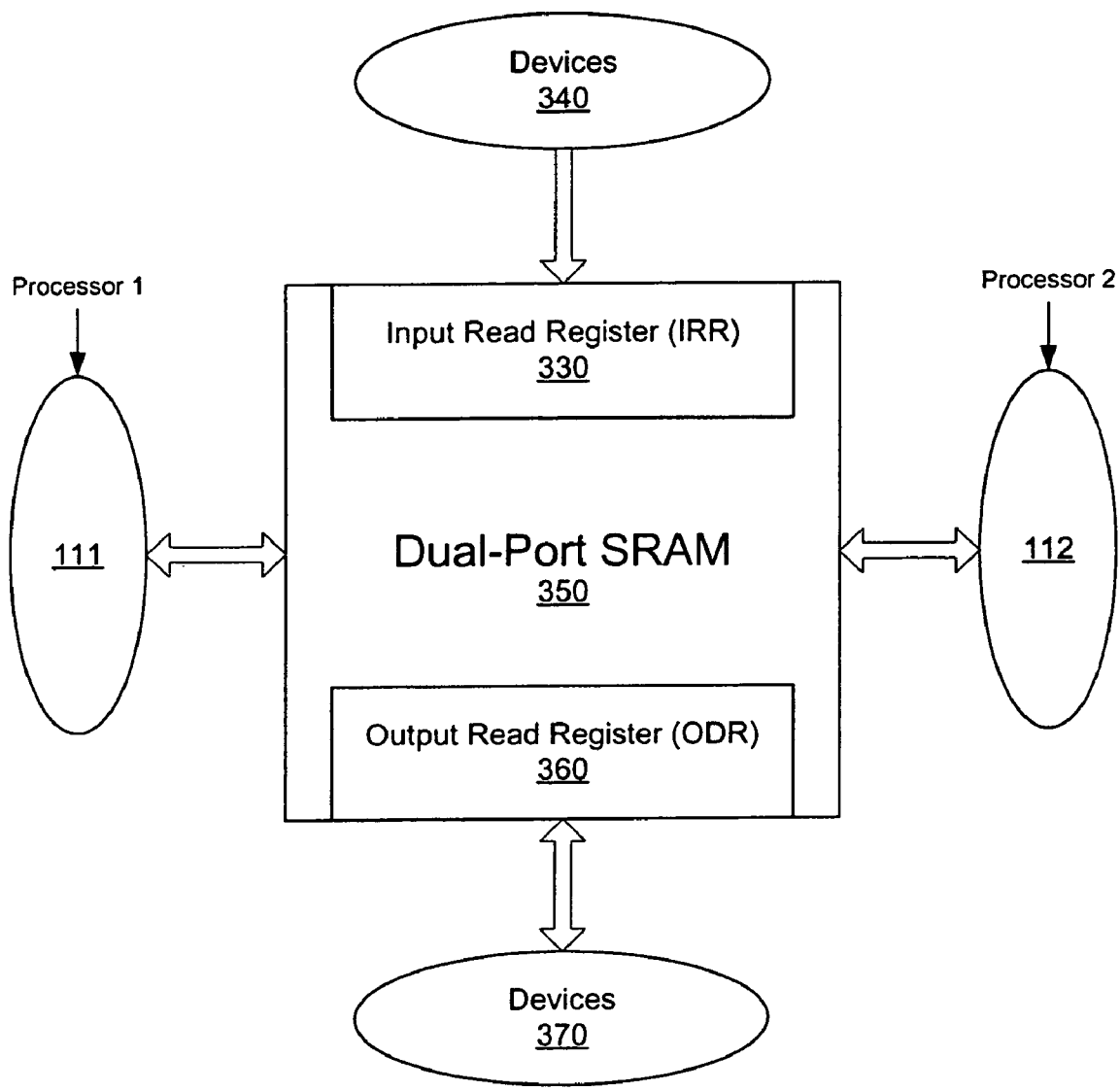
FIG. 3 illustrates a dual-port SRAM according to some embodiments of the invention.

Some embodiments of the invention utilize the dual-port SRAM. FIG. 3 illustrates a dual-port SRAM according to some embodiments of the invention. As shown in FIG. 3, two processors 111,112 can simultaneously utilize the dual-port SRAM 350. The embodiments illustrated include an input read register (IRR) 330 that can capture the state of external binary state devices 340, for example two external devices, and make their states available to either processor 111,112. The illustrated embodiments further include an output drive register (ODR) 360 that can control and monitor the state of external binary state devices 370, for example five external devices, and make this control and status available to either processor 111,112. In some embodiments, for example, the two sets of external binary state devices 340 and 370 can include one or more of the same external binary devices; while in other embodiments, the two sets can be mutually exclusive. It will be evident to those skilled in the art after review of this disclosure that these embodiments can be readily modified for more or less than two processors, more or less than one IRR and/or one ODR, and a varying number of external binary state devices. Such modifications are intended to be within the scope of the present invention.

In some embodiments, IRR 330 of the invention can capture the status, or states, of external binary state devices 340 (e.g., switches, etc.) that are connected to the input read pins of dual-port SRAM 350. IRR 330 can be given memory address x0000, although other addresses can be assigned without deviating from the scope of the invention. The contents of IRR 330 can be read as a standard memory access to address x0000 from any of the processors 111,112 (of which, for example only, two are shown in FIG. 3) and the data can be output via standard inputs and outputs (I/Os) of SRAM 350. For example, FIG. 4 illustrates an example of a two-device IRR 330 of the dual-port SRAM 350 according to some embodiments of the invention.

Figure 4:
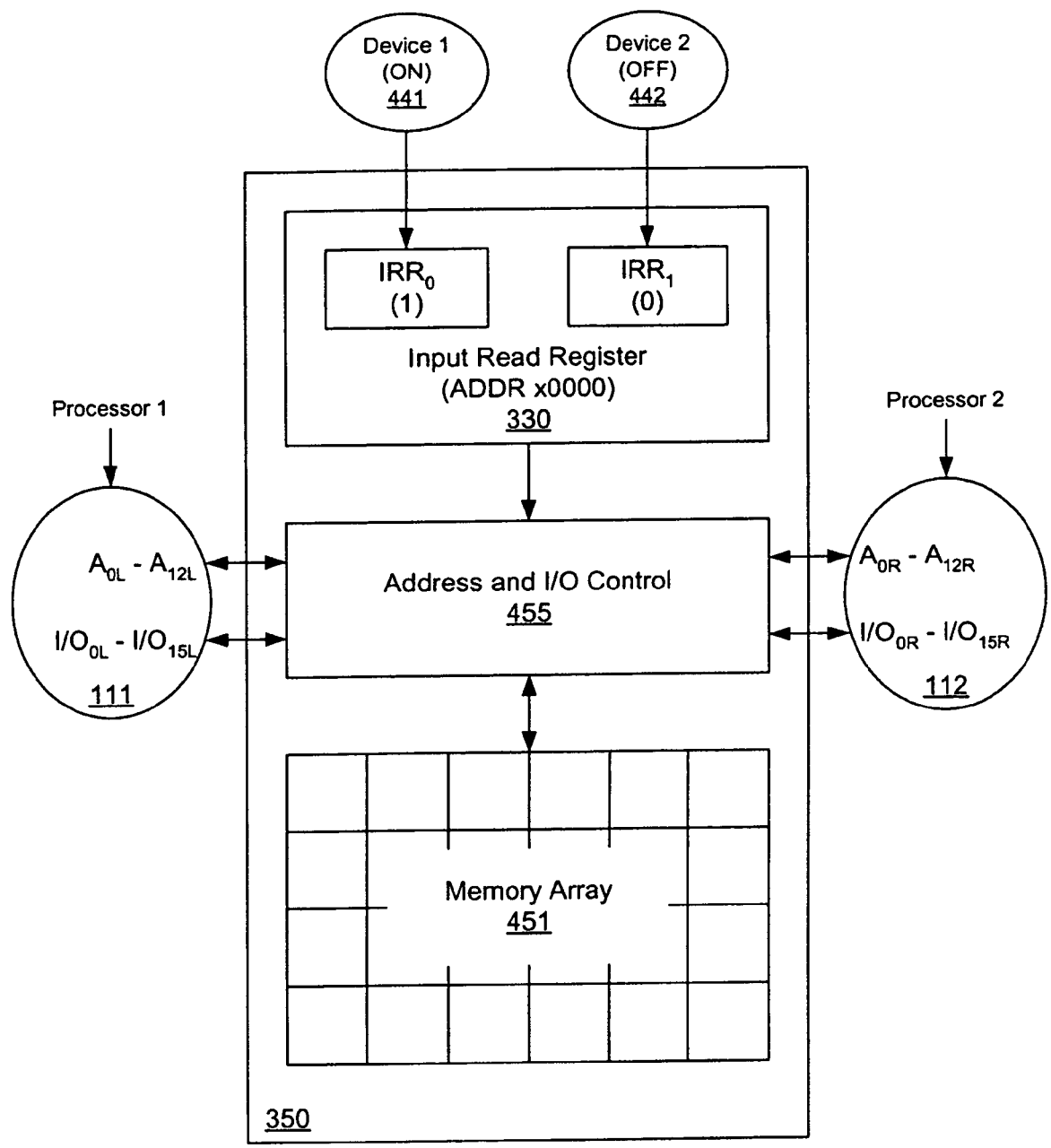
FIG. 4 illustrates a two-device Input Read Register (IRR) of a dual-port SRAM according to some embodiments of the invention.

The embodiment of dual-port SRAM 350 shown in FIG. 4 includes IRR 330, which can be a 16-bit memory location at memory address x0000. However, embodiments of the invention are equally applicable to memories of any bit-size. The SRAM 350 can utilize bit 0 (IRR$_0$) and bit 1 (IRR$_1$) of IRR 330 to monitor the status of, for example, two external binary state devices: device 1 441 and device 2 442, respectively. The address used by IRR 330 (i.e., x0000) can also be set for use by the SRAM 350 main memory array 451 for standard memory operations. Any of the processors 111,112 can access IRR 330, and thus the status of devices 441,442. However, it is not necessary to some embodiments of the present invention that every processor 111,112 be couple to IRR 330.

For example, processor 1 111 can execute a read command to SRAM address x0000 using address lines A$_{0L}$-A$_{12L}$. The states of devices 441 and 442 can be read from IRR 330 to input/output lines I/O$_{0L}$-I/O$_{15L}$ via the address and I/O control 455 of SRAM 350. In the example shown in FIG. 4, device 1 441 is on, which is reflected in bit IRR$_0$ as being high or "1". Likewise, device 2 442 is off, which is reflected in bit IRR$_1$ as being low or "0". Processor 2 112, can also access the states of the two devices 441,442 in a similar manner.

Table 1, below, defines the operation of embodiments of a dual-port SRAM 350 that includes an IRR 330 in accordance with the invention. As shown in Table 1, when $\overline{\text{SFEN}}$=V$_{1L}$, IRR 330 is active (i.e., IRR read mode is available to the processors) and address x0000 is not available for standard memory operations. During IRR read mode of address x0000, I/O$_0$ and I/O$_1$ are valid bits and I/O$_2$ through I/O$_{15}$ are "don't care" bits. As will now be apparent to those skilled in the art, the invention can include a varying number of valid and "don't care" IRR bits. Writes to address x0000 are not allowed from either processor port during IRR read mode because SRAM 350 mirrors the on/off status of devices 441 and 442 to IRR 330. When SRAM 350 special function enable input ($\overline{\text{SFEN}}$)=V$_{1H}$, IRR 330 is inactive (i.e., standard memory mode is available to the processors) and address x0000 can be used with the SRAM main memory array 451 for standard memory operations. This exemplary IRR 330 can support inputs up to approximately 3.5V (e.g., V$_{1L}$<=~0.4 V, V$_{1H}$>=~1.4 V). However, as will be evident to those skilled in the art upon review of this disclosure, varying input levels and alternative logic schemes for IRR 330 can also be used with aspects of some embodiments of the present invention. Such variations and alternatives are intended to be within the scope of the present invention.

TABLE 1

Input Read Register (IRR) Operation

| $\overline{\text{SFEN}}$ | $\overline{\text{CE}}$ | R/$\overline{\text{W}}$ | $\overline{\text{OE}}$ | $\overline{\text{UB}}$ | $\overline{\text{LB}}$ | ADDR | I/O$_0$-I/O$_1$ | I/O$_2$-I/O$_{15}$ | Mode |
|---|---|---|---|---|---|---|---|---|---|
| H | L | H | L | L | L | x0000-Max | Valid | Valid | Standard Memory |
| L | L | H | L | X | L | x0000 | Valid | X | IRR Read |

In some embodiments, referring again to FIG. 3, ODR 360 of the invention can determine and manipulate the status, or states, of external binary state devices 370 (e.g., LEDs) by providing a path to V$_{SS}$ and/or ground for the circuit of the external devices 370. The status of ODR 360, and thus external devices 370, can be set using standard write access from any of the processors 111,112 to address x0001 of SRAM 350, with a "1" corresponding to "on" for the associated device and a "0" corresponding to "off". The status of the ODR can also be read (without changing the status of the bits) via a standard read to address x0001 of the SRAM 350. For example, FIG. 5 illustrates a five-device output drive register (ODR) 360 of a dual-port SRAM 350 according to some embodiments of the invention.

Figure 5:
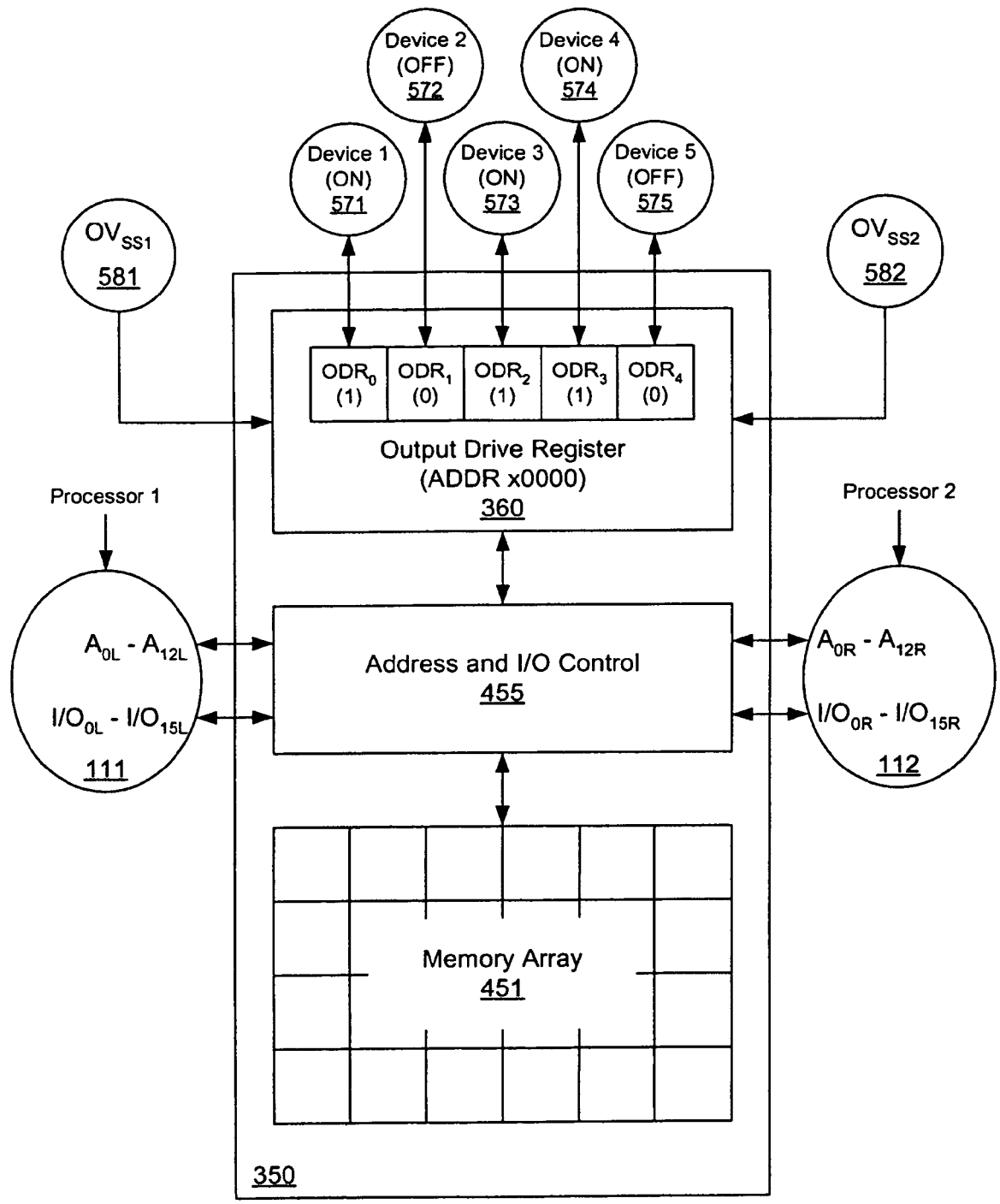
FIG. 5 illustrates a five-device Output Drive Register (ODR) of a dual-port SRAM according to some embodiments of the invention.

The embodiment of dual-port SRAM 350 shown in FIG. 5 includes ODR 360, which can be a 16-bit memory location at memory address x0001. However, embodiments of the invention are equally applicable to memories of any bit-size. SRAM 350 can utilize bit 0 (ODR$_0$) through bit 4 (ODR$_4$) of ODR 360 to control and monitor the status of, for example, five external binary state devices: device 1 571 through device 5 575, respectively. ODR 360 can also be used as part of the regular memory array 451 of SRAM 350. Any of the processors 111,112 can access ODR 330, and thus control and monitor the state of the devices 571-575. However, it is not necessary to some embodiments of the present invention that every processor 111,112 be couple to ODR 360.

For example, processor 1 111 can execute a write command to SRAM address x0001 using address lines A$_{0L}$-A$_{12L}$ and input/output lines I/O$_{0L}$-I/O$_{15L}$. Since, in this embodiment of dual-port SRAM 350 there are five external binary devices 571-575, bits 0-4 of the ODR 360 (i.e., ODR$_0$ through ODR$_4$) can be used to control and monitor the exemplary five devices, respectively. To turn on one of the devices, the processor writes a "1" to the corresponding bit of the ODR 360 for that device. When a bit of ODR 360 is set to "1", ODR 360 can provide a path to the SRAM 350 supply voltage(s) and/or ground (not shown) via one of two output voltages, OV$_{SS1}$, and OV$_{SS2}$ 581,581. The number and amplitude of output supply voltage(s) can vary by application. For example, the drive voltage for this exemplary ODR 360 might be between approximately 1.5 volts and about 3.5 volts, which can limit the total current draw of all attached devices to, for example, approximately 40 milliamps (mA) total. Likewise, to turn off one of the devices, the processor writes a "0" to that device's corresponding bit of the ODR 360, which opens the output supply voltage path for that device.

The status of devices 571 through 575 can also be read from the ODR 360 to any of the processors 111 or 112 without affecting the state or operation of the devices. This read operation is performed in a similar manner as with IRR 330. In the example shown in FIG. 5, device 1 571 is on, which is reflected in bit ODR$_0$ as being high or "1". Likewise, device 5 575 is off, which is reflected in bit ODR$_1$ as being low or "0". Further, a processor could change the on/off status of devices 1 and 5 571,575 by executing a write to address x0001 of the SRAM 350 that changes the state of ODR$_0$ to low or "0" and the state of ODR$_1$ to high or "1". Processor 2 112, can also control and monitor the states of devices 571 through 575 in a similar manner.

Table 2, below, defines the operation of embodiments of a dual-port SRAM 350 that includes an ODR 360 in accordance with the invention. As shown in Table 2, when $\overline{SFEN}$=V$_{1L}$, ODR 360 is active (i.e., ODR read/write mode is available to the processors) and address x0001 is not available for standard memory operations. During ODR read/write mode of address x0001, I/O$_0$ through I/O$_4$ are valid bits and I/O$_5$ through I/O$_{15}$ are "don't care" bits. As will now be apparent to those skilled in the art, the invention can include a varying number of valid and "don't care" ODR bits. In this mode, writes to address x0001 are allowed from any of the processors 111 or 112 when R/$\overline{W}$="L", and reads are allowed when R/$\overline{W}$="H". When $\overline{SFEN}$=V$_{1H}$, ODR 360 is inactive (i.e., standard memory mode is available to the processors) and address x0001 can be used with the SRAM main memory array 451 for standard memory operations. However, as will be evident to those skilled in the art upon review of this disclosure, varying input/output levels and alternative logic schemes for ODR 360 can also be used with aspects of some embodiments of the present invention. Such variations and alternatives are intended to be within the scope of the present invention.

Figure 6:
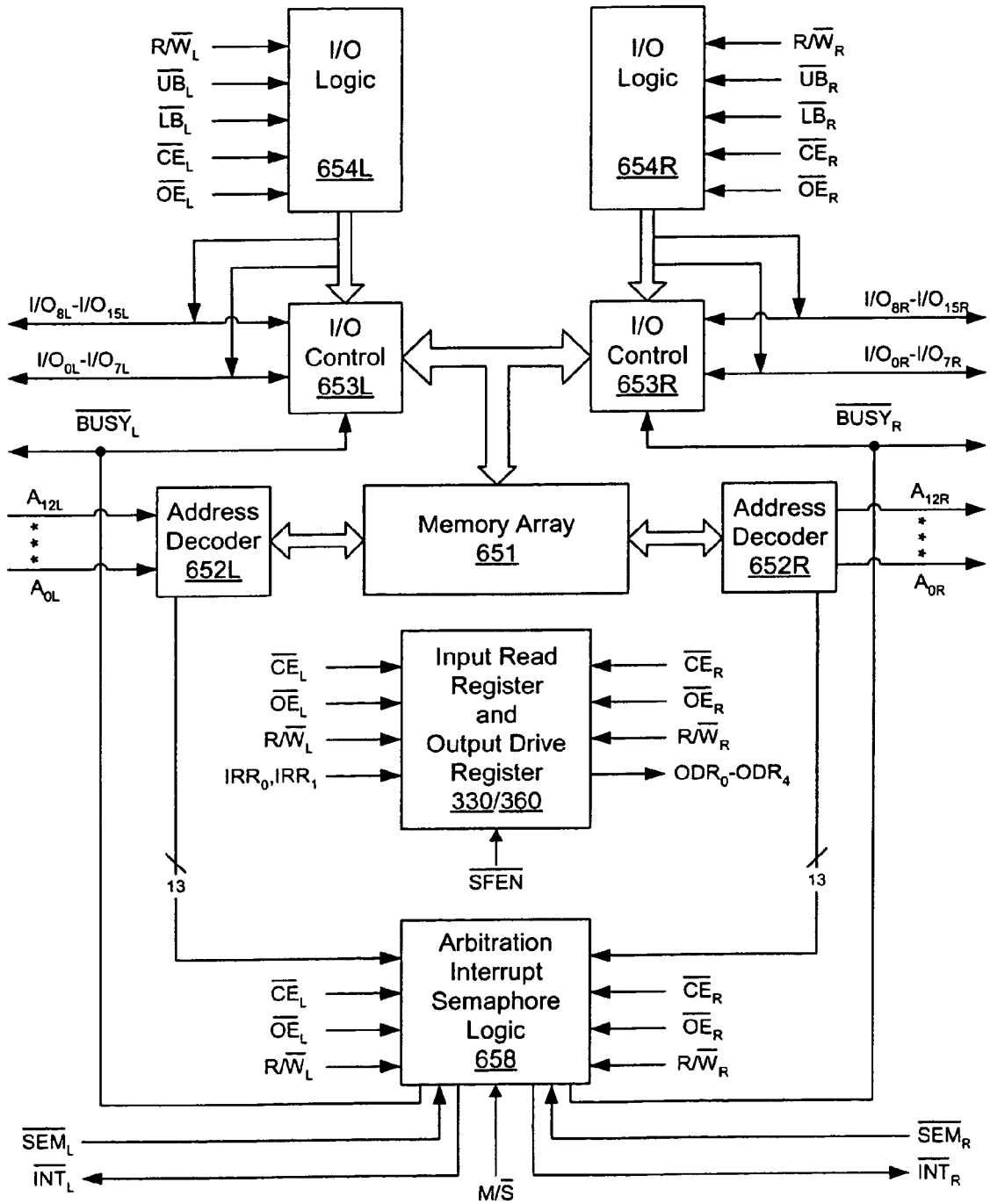
FIG. 6 illustrates a functional block diagram with signal routing for a dual-port SRAM according

FIG. 6 illustrates a functional block diagram 600 with signal routing for a dual-port SRAM according to some embodiments of the invention. As shown in exemplary FIG. 6, the block diagram 600 of the exemplary dual-port SRAM can include some blocks of the typical dual-port SRAM, for example: memory array 651; address decoders 652L/R; I/O control 653L/R; I/O logic 654L/R; and arbitration, interrupt and semaphore logic 658. Further, the signal pins of this exemplary SRAM can include some typical signal, for example: $\overline{CE}_{L/R}$; $\overline{OE}_{L/R}$; and R/$\overline{W}_{L/R}$. However, an SRAM according to the present invention can also include the IRR/ODR functional block 330/360, which uses the signals $\overline{SFEN}$, IRR$_{0-1}$ and ODR$_{0-4}$.

Figure 7:
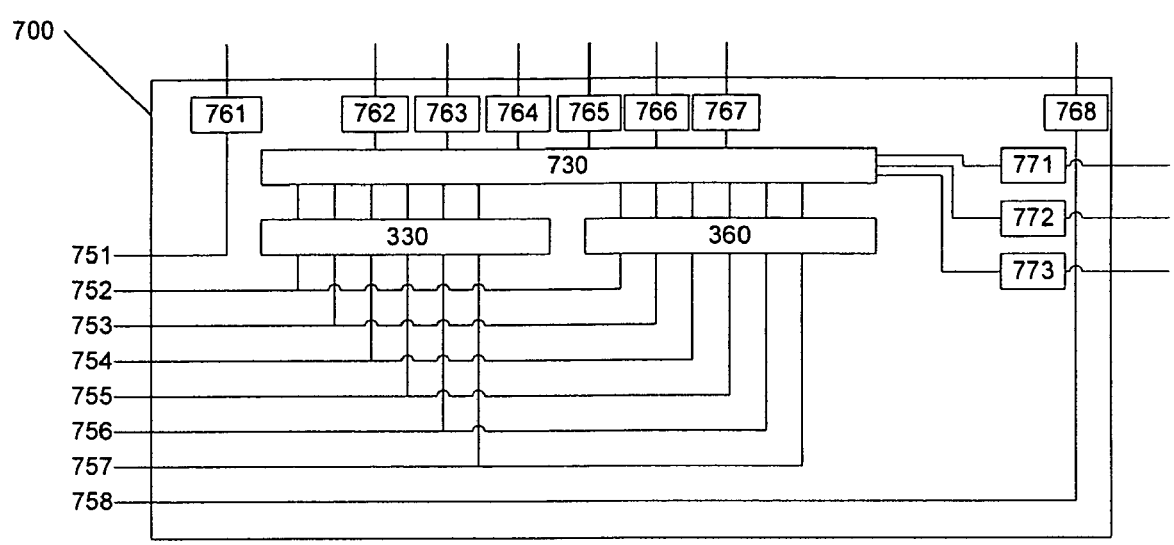
FIG. 7 illustrates a block diagram of a module of a memory device that specifies which bits are associated with input read registers and output drive registers.

FIG. 7 illustrates a block diagram of a module 700 of a memory device 350 that specifies which bits are associated with input read registers and output drive registers. In some embodiments, module 700 may comprise at least one IRR 330, at least one ODR 360, and at least one special function decode module 730. Special function decode module 730 may be coupled to IRR 330 and ODR 360. IRR 330 and ODR 360 may be coupled to other elements of a memory device or to external binary devices via links 752, 753, 754, 755, 756, and 757. Links 752, 753, 754, 755, 756, and 757 may be connected to external connectors, such as pins, on a memory device.

Special function decode module 730 may take as input one or more controlling bits 771, 772, and 773. The controlling bits 771, 772, and 773 may be set by an internal memory device, such as a flash ROM (not pictured), or may be set via pins external to a memory device. In some embodiments, controlling bits 771, 772, and 773 may be special function register bits 771, 772, and 773. Special function register bits 771, 772, and 773 may be set at power-up of a memory device 350 or may be set dynamically during device operation. Special function decode module 730 may determine which controlled bits 762, 763, 764, 765, 766, and 767 are coupled to IRR 330 and which are coupled to ODR 360 based on controlling bits 771, 772, and 773. For example, the controlling bits 771, 772, and 773 may define which controlled bits 762, 763, 764, 765, 766, and 767 are coupled to IRR 330 and ODR 360 based on Table 3. In the example of Table 3, if all three controlling bits are set to zero, then all of the controlled bits 762, 763, 764, 765, 766, and 767 may be coupled to ODR 360. On the other hand, if the controlling bits are set in another manner, then a different mixture of controlled bits are coupled to IRR 330 and ODR 360. In some embodiments, there may be a disabling setting (depicted in Table 3 as occurring then controlling bits 771, 772, and 773 are each set to one) in which no controlled bit 762, 763, 764, 765, 766, or 767 is coupled to either IRR 330 or ODR 360.

TABLE 2

| | | | | | | Output Drive Register (ODR) Operation | | | |
|---|---|---|---|---|---|---|---|---|---|
| $\overline{SFEN}$ | $\overline{CE}$ | R/$\overline{W}$ | $\overline{OE}$ | $\overline{UB}$ | $\overline{LB}$ | ADDR | I/O$_0$-I/O$_4$ | I/O$_5$-I/O$_{15}$ | Mode |
| H | L | H | X | L | L | x0000-Max | Valid | Valid | Standard Memory |
| L | L | L | X | X | L | x0001 | Valid | X | ODR Write |
| L | L | H | L | X | L | x0001 | Valid | X | ODR Read |

TABLE 3

| | Programmable IRR & ODR | | | | | | | |
|---|---|---|---|---|---|---|---|---|
| 771 | 0 | 0 | 0 | 0 | 1 | 1 | 1 | 1 |
| 772 | 0 | 0 | 1 | 1 | 0 | 0 | 1 | 1 |
| 773 | 0 | 1 | 0 | 1 | 0 | 1 | 0 | 1 |
| Send to IRR 330 | N/A | 762 | 762-763 | 762-764 | 762-765 | 762-766 | 762-767 | N/A |
| Send to ODR 360 | 762-767 | 763-767 | 764-767 | 765-767 | 766-767 | 767 | N/A | N/A |

In some embodiments, both IRR 330 and ODR 360 are coupled to each link 752, 753, 754, 755, 756, and 757. IRR 330 and ODR 360 may couple particular signals from the special function decode module 730 to link 752, 753, 754, 755, 756, and 757. Therefore, in some embodiments, when special function decode module 730 couples particular controlled bits, for example, controlled bits 762 and 763 to IRR 330, and IRR 330 couples those particular controlled bits 762 and 763 to corresponding links 752 and 753, then controlled bits 762 and 763 may effectively act as part of IRR 330, and the memory device may be able to represent the state of binary devices connected to links 752 and 753 at controlled bits 762 and 763, respectively.

Similarly, if special function decode module 730 couples particular controlled bits, for example, controlled bits 766 and 767, to ODR 360, and ODR 360 couples its inputs from special function decode module 730 to corresponding links 756 and 757, then controlled bits 766 and 767 may effectively act as part of ODR 360, and the memory device may be able to represent and modify the state of binary devices connected to links 756 and 757 via controlled bits 766 and 767, respectively.

In some embodiments, bits 761 and 768 may be coupled directly to links 751 and 758, respectively, thereby bypassing the assignment mechanism of special function decode module 730. Bits 761 and 768 may each be associated with input read register 330 and/or an output drive register 360.

In some embodiments, each controlling bit 771, 772, and 773 may correspond to one or more controlled bits 762, 763, 764, 765, 766, and 767. For example, if there were one controlling bit 771, 772, and 773 for each controlled bit 762, 763, 764, then each controlling bit 771, 772, and 773 could be used by special function decode module 730 to determine whether to associate the corresponding controlled bit 762, 763, or 764, respectively, with IRR 330 or ODR 360. In other embodiments, such as those associated with Table 3, the controlling bits 771, 772, and 773, taken together may define states that indicate which of the controlled bits 762, 763, 764, 765, 766, and 767 are coupled to each of IRR 330 and ODR 360.

As would be appreciated by those skilled in the art, in some embodiments (not pictured), the features discussed with respect to FIG. 7 may be performed using more than one IRR 330, ODR 360, and/or special function decode module 730. Additionally, different numbers of bits 761 and 768; controlling bits 771, 772, and 773; and controlled bits 762, 763, 764, 765, 766, and 767 may be used.

Although embodiments of the present invention have been particularly described with reference to embodiments thereof, it should be readily apparent to those of ordinary skill in the art that various changes, modifications and substitutes can be made without departing from the spirit and scope of the invention. Such changes, modifications and substitutes are intended to be within the scope of the claimed invention. Accordingly, it will be appreciated that in numerous instances, some features of the invention will be employed without a corresponding use of other features. Further, those skilled in the art will understand that variations can be made in the number and arrangement of components illustrated in the above figures. For example, while specific reference is made to a static random access memory device, other memory types can also employ embodiments of the invention described herein. Additionally, while the processors used in the above examples are impliedly external to the memory device, those skilled in the art will recognize that a single integrated circuit chip might contain multiple processor cores as well as the memory device of the present invention (i.e., a system-on-a-chip). Further, some simple controllers that do not include GPI/O pins can now be given that I/O functionality by implementing embodiments of the invention. It is intended that the scope of the appended claims include such changes, modifications and substitutions.

What is claimed is:

1. A memory device, comprising:
   one or more controlling bits, wherein each controlling bit is capable of being set; and
   one or more controlled register bits coupled to the one or more controlling bits, wherein each controlled register bit is capable of being coupled to an external binary state device, each binary state device being located external to the memory device;
   wherein the setting of the one or more controlling bits defines which controlled register bits of the one or more controlled register bits are input read register bits and which are output drive register bits; and wherein,
   each input read register bit is capable of reflecting a state signal associated with an external binary state device coupled to the input read register bit, and
   each output drive register bit is capable of reflecting a state signal associated with an external binary state device coupled to the output drive register bit and is further capable of altering the state signal associated with the external binary state device coupled to the output drive register; and further wherein
   the memory device is capable of modifying the state of the external binary state device coupled to each controlled register bit by providing a path from the external binary state device to each controlled register bit to an output supply voltage or ground coupled to the memory device.

2. The device of claim 1, wherein the memory device further comprises a first bit that is fixed as an input read register bit and a second bit that is fixed as an output drive register bit.

3. The device of claim 1, wherein each controlling bit corresponds to a set of one or more controlled bits, and each controlling bit is used to determine whether the corresponding controlled bits are associated with the output drive register or input read register.

4. The device of claim 1, wherein the controlling bits, taken together, define states that indicate which of the controlled bits are associated with the output drive register and which are associated with the input read register.

5. The device of claim 1, further comprising one or more ports, where each port is capable of interfacing with external read/write signals and each port is coupled to the controlled register bits.

6. The device of claim 5, wherein each port is capable of reading values from each input read register bit and each port is capable of writing values to each output drive register bit.

7. The device of claim 1, wherein the controlling bits are defined dynamically based on an input signal.

8. The device of claim 1, wherein the controlling bits each correspond to a pin on a chip.

9. The device of claim 1, wherein the controlling bits are set at startup.

10. The device of claim 1, wherein the controlled register bits each correspond to a pin on a chip.

11. The memory device of claim 1 having a special function decode module coupled to the input read register and the output drive register.

12. The memory device of claim 11 wherein the special function decode module determines which controlled bits are coupled to the input read register and which controlled bits are coupled to the output drive register, based on one or more controlling bits.

13. A memory device, comprising:
one or more ports, each port capable of interfacing with external read/write signals;
an input read register coupled to the one or more ports and to a first set of external binary state devices, the input read register associated with a first memory address;
an output drive register coupled to the one or more ports and to a second set of external binary state devices, the output drive register associated with a second memory address;
one or more controlling bits, wherein each controlling bit is capable of being set; and a
set of controlled register bits, wherein the set of controlled register bits comprise a first set of bits and a second set of bits and setting the one or more controlling bits defines which controlled register bits are in the first set of bits and which are in the second set of bits; and wherein,
the input read register includes the first set of bits, and the first set of bits are capable of reflecting a first set of state signals associated with the first set of external binary state devices, and
the output drive register includes the second set of bits, and the second set of bits are capable of reflecting a second set of state signals associated with the second set of external binary state devices and are further capable of altering the second set of state signals associated with the second set of external binary state devices; and further wherein
the memory device is capable of modifying the state of the external binary state device coupled to each controlled register bit by providing a path from the external binary state device to each controlled register bit to an output supply voltage or ground coupled to the memory device.

14. A memory device, comprising:
one or more ports, each port capable of interfacing with external read/write signals;
one or more controlling bits, wherein each controlling bit is capable of being set; and a set of controlled register bits, wherein setting the one or more controlling bits defines a set of bits of the set of controlled register bits to associate with an input read register; and
the input read register coupled to the one or more ports and to a set of external binary state devices, each external binary state device of the set of external binary state devices being located external to the memory device, wherein the input read register is associated with a memory address, wherein the set of bits are capable of reflecting a set of state signals associated with the set of external binary state devices at the memory address; and further wherein
the memory device is capable of modifying the state of the external binary state device coupled to each controlled register bit by providing a path from the external binary state device to each controlled register bit to an output supply voltage or ground coupled to the memory device.

15. A memory device, comprising:
one or more ports, each port capable of interfacing with external read/write signals;
one or more controlling bits, wherein each controlling bit is capable of being set; and
a set of controlled register bits, wherein setting the one or more controlling bits defines a set of bits of the one or more controlled register bits to associate with an output drive register; and
the output drive register coupled to the one or more ports and to a set of external binary state devices, each external binary state device of the set of external binary state devices being located external to the memory device, the output drive register associated with a memory address, wherein the set of bits are capable of altering a set of state signals associated with the set of external binary state devices via the memory address and further wherein
the memory device is capable of modifying the state of the external binary state device coupled to each controlled register bit by providing a path from the external binary state device to each controlled register bit to an output supply voltage or ground coupled to the memory device.

16. A method for controlling states of a plurality of external binary state devices coupled to a memory device, each external binary state device of the external binary state devices being located external to the memory device, the method comprising the steps of:
coupling one or more processors to the memory device;
setting one or more controlling bits;
using a special function decode module coupled to an input read register (IRR) and an output driver register (ODR) to determine, based on the one or more controlling bits, at least one bit from a set of controlled register bits for reflecting a state of at least one of the plurality of external binary state devices;
reading, using the one or more processors, to a first memory location of the memory device, wherein the first memory location corresponds to the one or more bits that reflect the state of the at least one of the plurality of external binary state devices; and
controlling the states of the external binary state device by providing a path from the plurality of external binary state devices to an output supply voltage or ground coupled to the memory device.

17. A method for controlling states of a plurality of external binary state devices coupled to a memory device, each external binary state device of the external binary state devices being located external to the memory device, the method comprising the steps of:
- coupling one or more processors to the memory device;
- setting one or more controlling bits;
- using a special function decode module coupled to an input read register (IRR) and an output driver register (ODR) to determine, based on the one or more controlling bits, at least one bit from a set of controlled register bits for controlling the change of a state of one or more of the plurality of external binary state devices; and
- writing, using the one or more processors, to a memory location of the memory device,
  wherein the memory location corresponds to the one or more bits that control the change of state of the one or more of the plurality of external binary state devices; and
- controlling the states of the external binary state device by providing a path from the plurality of external binary state devices to an output supply voltage or ground coupled to the memory device.

18. A method for controlling states of a plurality of external binary state devices coupled to a memory device, each external binary state device of the external binary state devices being located external to the memory device, the method comprising:
- coupling one or more processors to the memory device;
- setting one or more controlling bits;
- using a special function decode module coupled to an input read register (IRR) and an output driver register (ODR) to determine, based on the one or more controlling bits, a first set of one or more bits from a set of controlled register bits for reflecting a first state of a first one of the plurality of external binary state devices and a second set of one or more bits from the set of controlled register bits for controlling the change of a state of a second one of the plurality of external binary state devices; and
- monitoring the first state of the first one of the plurality of external binary state devices using the first set of one or more bits; and
- manipulating the second state of the second one of the plurality of external binary state devices using the second set of one or more by providing a path from the plurality of external binary state devices to an output supply voltage or ground coupled to the memory device.

19. A system for controlling and monitoring one or more external binary state devices, the system comprising:
- a multi-port memory device that includes a memory array, an input read register and an output drive register, each coupled to a plurality of ports of the multi-port memory device;
- a plurality of processors coupled to the plurality of ports, wherein each processor is capable of executing an instruction that reads to a first memory address of the multi-port memory device, and reads and writes to a second memory address of the multi-port memory device;
- one or more controlling bits, wherein each controlling bit is capable of being set; and
- a set of controlled register bits, wherein setting the one or more controlling bits defines which controlled register bits are associated with the input read register and which are associated with the output drive register; and wherein
  the input read register is associated with the first memory address and is coupled to a first set of the one or more external binary state devices, and the output drive register associated with the second memory address and is coupled to a second set of the one or more external binary state devices; and further wherein
  the memory device is capable of modifying the state of the external binary state device coupled to each controlled register bit by providing a path from the external binary state device to each controlled register bit to an output supply voltage or ground coupled to the memory device.

20. A system for controlling and monitoring one or more binary state devices, the system comprising:
- a multi-port memory device that includes a memory array and a register, each coupled to a plurality of ports of the multi-port memory device;
- a plurality of processors coupled to the plurality of posts, wherein each processor is capable of executing an instruction that reads and writes to a memory address of the multi-post memory device;
- one or more controlling bits, wherein each controlling bit is capable of being set; and
- a set of controlled register bits associated with the register, wherein setting the one or more controlling bits defines which controlled register bits are associated with the memory address, and wherein the register is coupled to a set of the one or more binary state devices; and further wherein
  the memory device is capable of modifying the state of the external binary state device coupled to each controlled register bit by providing a path from the external binary state device to each controlled register bit to an output supply voltage or ground coupled to the memory device.

* * * * *